United States Patent [19]
Consiglio et al.

[11] Patent Number: 5,594,611
[45] Date of Patent: Jan. 14, 1997

[54] INTEGRATED CIRCUIT INPUT/OUTPUT ESD PROTECTION CIRCUIT WITH GATE VOLTAGE REGULATION AND PARASITIC ZENER AND JUNCTION DIODE

[75] Inventors: Rosario Consiglio, San Jose; Gina M. Sparacino, Milpitas, both of Calif.

[73] Assignee: LSI Logic Corporation, Milpitas, Calif.

[21] Appl. No.: 180,741

[22] Filed: Jan. 12, 1994

[51] Int. Cl.⁶ .................................................. H02H 9/00
[52] U.S. Cl. ............................... 361/118; 361/56; 361/91
[58] Field of Search .............................. 361/56, 91, 118, 361/111

[56] References Cited

U.S. PATENT DOCUMENTS

| | | | |
|---|---|---|---|
| 3,777,216 | 12/1973 | Armstrong | 361/56 |
| 4,807,080 | 2/1989 | Clark | 361/56 |
| 4,819,047 | 4/1989 | Gilfeather et al. | 361/56 |
| 4,870,530 | 9/1989 | Hurst et al. | 361/91 |
| 4,890,187 | 12/1989 | Tailliet et al. | 361/111 |
| 4,922,371 | 5/1990 | Gray et al. | 361/91 |
| 4,962,320 | 10/1990 | Okada et al. | 361/56 |
| 4,990,802 | 2/1991 | Smooha | 307/482 |
| 5,028,819 | 7/1991 | Wei et al. | 361/91 |
| 5,051,853 | 9/1991 | Hosoya | 360/99.08 |
| 5,051,860 | 9/1991 | Lee et al. | 361/91 |
| 5,060,037 | 10/1991 | Rountree | 357/23.13 |
| 5,086,365 | 2/1992 | Lien | 361/56 |
| 5,138,413 | 8/1992 | Grosset et al. | 361/91 |
| 5,157,573 | 10/1992 | Lee et al. | 361/56 |
| 5,159,518 | 10/1992 | Roy | 361/56 |

OTHER PUBLICATIONS

Charvaka Duvvury and Carlos Diaz, "Dynamic Gate Coupling of NMOS For Effecient Output ESD Protection," IEEE Proceedings of the IRP, Sanvary, 1992, pp. 141–150.

*Primary Examiner*—Jeffrey A. Gaffin
*Assistant Examiner*—Stephen Jackson
*Attorney, Agent, or Firm*—Poms, Smith, Lande & Rose

[57] ABSTRACT

An integrated circuit structure with input/output gate voltage regulation and parasitic zener and junction diodes for protection against damage resulting from electrostatic discharge (ESD) events. The circuit includes a first protective FET connected between an input/output pad and a ground potential of the integrated circuit. A diode voltage regulator is also connected between the gate of the first protective FET and a reference potential of the integrated circuit. The first protective FET receives a voltage from its gate-drain overlap capacitance during an ESD event. The diode is operative during an ESD event to provide a sufficient voltage to the first FET gate to permit a desired ESD current flow through the first protective FET. In one embodiment the first FET is an NMOS device and the diode voltage regulator is a series of p-n forward biased diodes.

10 Claims, 4 Drawing Sheets

INTEGRATED CIRCUIT INPUT/OUTPUT ESD PROTECTION CIRCUIT WITH GATE VOLTAGE REGULATION AND PARASITIC ZENER AND JUNCTION DIODE

BACKGROUND OF THE INVENTION

1. Field of the Invention

The present invention relates generally to protection of integrated circuit elements from damage due to electrostatic discharge (ESD). More particularly, the present invention relates to an ESD protection circuit suitable for use in CMOS integrated circuit input/output (I/O) buffers.

2. Description of Related Art

The problem of Electrostatic Discharge (ESD) damage is particularly severe in metal-oxide-semiconductor (MOS) integrated circuits. As a result, MOS I/O buffers generally include some form of ESD protection circuit.

One type of ESD protection circuit in accordance with the prior art is shown in FIG. 1(a), a single exemplary integrated circuit output pad 10 provides an interconnection between internal logic circuitry and the external pins of the device. The internal logic circuitry shown includes an operative PMOS field effect transistor (FET) M1 and an operative NMOS FET M2. The word "operative" as used herein will refer to internal integrated circuit transistors which are used for logic or other normal functional operations within the integrated circuit. The operative transistors should be distinguished from the "protective" transistors which are those used solely for ESD protection purposes. The exemplary circuit of FIG. 1(a) includes two NMOS protective transistors M3 and M4. Transistor M3 is a thick field oxide NMOS FET which has a gate connected to the output pad 10. The drain of M3 is connected to the gate of transistor M4, a thin oxide NMOS FET. The drain of transistor M4 is connected to output pad 10 and the sources of both transistors M3 and M4 are connected to a ground potential 18 within the integrated circuit.

Operative transistor M1 and M2 are connected in series between a supply voltage potential 16 and ground potential 18. The gates of operative transistors M1 and M2 receive internal logic signals from other parts of the integrated circuit via signal input lines 12, 14 respectively. M1 and M2 are arranged in an invertor configuration commonly used in CMOS output buffers. If signal input lines 12, 14 were tied together to a single logic line, the inverse of the value on the logic line would be continuously supplied to output pad 10.

Protective transistors M3 and M4 become operative during an ESD event. The high voltage typically generated by an ESD event turns on the thick field oxide NMOS FET M3. The current passing through transistor M3 in turn affects the voltage at the gate of transistor M4. The voltage at the gate of M4 is controlled in order to turn it on and discharge the charge present at the output pad 10 from the ESD event. Transistor M3 is constructed as a thick field oxide device in order to prevent damage to the oxide during the ESD event. Transistor M4 may be a thin oxide device constructed in a manner similar to that used to construct operative transistor M2. An N-well resistor R1 is typically tied to the gate of transistor M4 in order to eliminate any potential false triggering or leakage through M4 during normal operation of the output buffer.

The above described circuitry controls the gate voltage present in thin oxide devices during an ESD event at their drains. The ESD event induces a voltage from displacement current as a result of parasitic capacitance between the thin oxide gate polysilicon and the drain diffusion (drain overlap capacitance). The thick field oxide device is a voltage regulator which controls the potential on the thin oxide polysilicon gate. This technique for controlling the thin oxide gate potential is known to those skilled in the art as "dynamic gate coupling". In order to optimize the desired protection in a given application, it is necessary to, in effect, "custom design" the parameters of M3 and M4 to satisfy the requirements of that application. It is therefore necessary, under current practice, to expend significant additional design effort when using the protective circuitry of FIG. 1(a). A single standardized design is generally not suitable for a large number of applications. Both design and manufacturing costs are increased as a result.

A second type of prior art protection circuit is shown in FIG. 1(b). The operation of this circuit is similar to that of FIG. 1(a), except the "unused" protective FET M4 is now also an operational FET. The FET M2 serves at both an operative FET, accepting internal logic signals form other parts of the integrated circuit via signal input lines 20 and invertor 22. The output of invertor 22 is applied to the gate of M2 and the drain of thick field oxide NMOS FET M3. The protective operation of the FETS M2 and M3 are similar to that described above. An ESD pulse coupled to the gate of M3 regulates a voltage on the gate of M2. FET M3 controls the impedance of M2 during the ESD event, providing a measure of protection during an ESD event.

The NMOS transistors M2, M3 and M4 in FIGS. 1(a) and 1(b) are shown with their parasitic lateral NPN bipolar transistors in phantom. The lateral bipolars arise as a consequence of the construction of the NMOS devices. A NMOS device typically consists of two N+ regions in a P-well formed on a P-type substrate. The two N+ regions are thus separated by a P region, creating a lateral NPN bipolar transistor. The parasitic bipolar includes a base resistor $R_b$ the value of which is a function of the resistivity of the P-well material. The parasitic bipolar is triggered during the ESD pulse and provides a high current carrying capacity during avalanche mode. Although each NPN transistor includes a lateral bipolar parasitic, the operation of only a single parasitic during an ESD event will cause an excessive increase in the heating of the parasitic, which can cause its metallization to melt, shorting to the drain or source, or otherwise damaging the NMOS device. It is therefore necessary to design the NMOS FETS such that the maximum number of lateral bipolar parasitics trigger simultaneously during an ESD event. An approach disclosed in "Dynamic Gate Couple of NMOS for Efficient Output ESD Protection" by C. Duvvury and C. Diaz, Proceedings of the IRPS, 1992, pp. 141–150, found that optimal lateral bipolar triggering is achieved by controlling the voltage at the gate of M2, as determined by the size of the field oxide NMOS FET M3. These additional design efforts are therefore required under present practice in achieving optimal protection for a given application.

Another typical prior art ESD protection circuit uses a thin gate oxide NMOS FET with a grounded gate. One such circuit is disclosed in U.S. Pat. No. 5,159,518. As shown in FIGS. 1 and 3 of the '518 patent a grounded gate NMOS device is combined with a series input resistor and an input diode to provide ESD protection for a CMOS integrated circuit input buffer.

Other presently available ESD protection circuits utilize a thick field oxide NMOS FET. The thick field oxide NMOS FET generally has both its gate and its drain connected to the pad, and its source connected to ground. Another example of this type of circuit is disclosed in U.S. Pat. No. 4,819,047. See FIGS. 4 and 5, and column 6, lines 19–54.

The prior art protection circuit disclosed in U.S. Pat. No. 4,807,080 combines a grounded gate NMOS FET with a thick field oxide NMOS FET. See FIG. 5 and column 5, lines 15–65. However, even with both of these devices, the protective circuit still requires a series diffusion resistor to provide adequate input buffer ESD protection.

Each of the above prior art designs are limited in the amount of ESD protection they can provide, given the basic protection elements discussed above. As a result, most include significant additional circuitry which adds cost and complexity to the integrated circuit. The additional circuitry may also adversely impact the functional performance of the integrated circuit, as is the case with a series diffusion resistor.

In addition, none of the circuits discussed above can provide optimal protection in terms of proper triggering of the maximum number of lateral bipolar transistors without substantial redesign for different applications. There is no presently available standardized technique for providing ESD protection in CMOS input/output (I/O) buffers. It is therefore necessary to employ a variety of different protection techniques in order to meet design goals. The cost of CMOS devices is thereby adversely affected.

It can be seen from the above that a need exists for a simple and inexpensive means of providing a standardized ESD protection circuit suitable for use in a wide variety of applications. A further need exists for providing a means of enhancing the protection provided by NMOS output buffer FETS without adversely impacting circuit performance or production cost.

SUMMARY OF THE INVENTION

The present invention provides an ESD protection circuit particularly well suited for use in a MOS integrated circuit. The protection circuit includes a first protective FET connected between an input/output pad and a ground potential of the integrated circuit. The gate of the first protection FET receives a voltage from its gate-drain overlap capacitance during an ESD event. The diode voltage regulator is connected between the gate of the first protective transistor and the integrated circuit potential, and is operative to provide a sufficient voltage to the gate during an ESD event such that a desired amount of the ESD current flows through the first protective transistor.

In accordance with one aspect of the present invention, the first protective transistor is a NMOS FET with its drain connected to the integrated circuit pad, and its source connected to a ground potential. The diode voltage regulator attached to the gate of the first protective transistor includes a series connection of four p-n forward biased diodes arranged with the anode of the first diode in the series combination connection to the gate of the first protective transistor, the cathode of the first diode connected to the anode of the next diode, and the rest of the diodes in the series combination connected in the same polarity, with the cathode of the final diode in the series combination connected to the ground potential of the integrated circuit. The diode voltage regulator serves to maintain the gate of the first protective transistor at a suitable voltage value during an ESD event. A controlled amount of current is thereby passed through the first protective transistor to avert damage to the internal circuitry of the integrated circuit. The first protective transistor will typically be an otherwise unused "spare" NMOS transistor within the integrated circuit.

In accordance with another aspect of the present invention, the integrated circuit includes a first and second operative transistor attached to and providing an output on the pad, the first operative transistor is a PMOS FET with its drain connected to the pad, its source connected to an integrated circuit voltage supply, and its gate attached to other internal functional circuitry. The second operative transistor is an NMOS FET with its drain connected to the pad, its source connected to ground, and its gate attached to other internal functional circuitry. The PMOS FET is formed in such a manner as to create a parasitic conductive path between the pad and ground potential to provide additional protection during and ESD event. The parasitic conductive path includes a parasitic p-n junction diode and a parasitic Zener diode with the anode of the p-n junction diode connected to the pad, and its cathode connected to the cathode of the Zener diode, with the anode of the Zener diode connected to ground potential. The Zener diode has a reverse breakdown voltage less than the avalanche breakdown voltage of the NMOS protective transistor such that both provide protection during an ESD event.

As a feature of the present invention, a standard gate voltage regulation is provided which avoids the need to custom design various circuit parameters optimize dynamic gate coupling for a specific application. The gate voltage regulation of the present invention is suitable for use with many different input and output buffer designs.

As another feature of the present invention, a method of output buffer construction is provided which creates a parasitic conductive path junction diode and Zener diode. This parasitic path further enhances the ESD protection capability of the circuit as applied to an integrated circuit output buffer.

As yet another feature of the present invention, the ESD protection circuit is simple to implement and does not adversely affect I/O buffer cost, complexity or performance.

These and many other advantages and features of the present invention will be readily apparent to those skilled in the art from the following drawings and detailed descriptions.

DETAILED DESCRIPTION OF THE PREFERRED EMBODIMENTS

The following description is directed to several exemplary embodiments of the present invention. It should be understood that many other alternative implements are possible. For example, although each embodiment shown is implemented in a CMOS integrated circuit output buffer, the invention may also be applied to CMOS input buffers or to any other type of integrated circuit signal lines susceptible to damage from ESD. The protective transistors shown are all NMOS to correspond to the most commonly used CMOS output buffer configurations. However, it is also possible to implement the present invention using PMOS devices as protective transistors by making minor adjustments in a manner well known in the art. Furthermore, a variety of alternative fabrication techniques may be used to produce the protective elements shown schematically in FIGS. 2, 3, and 4.

Figure 1A:
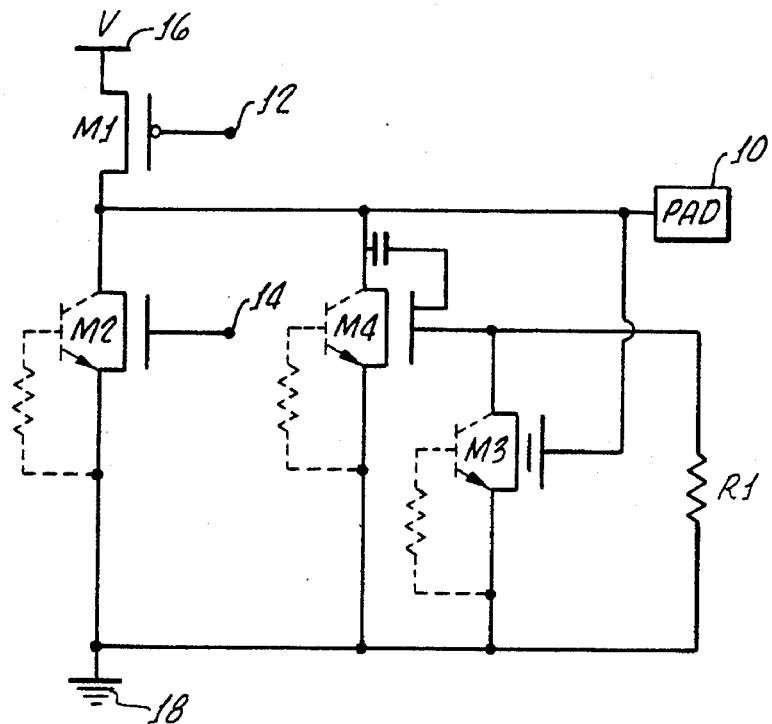
FIG. 1(a) shows an exemplary portion of a CMOS integrated circuit output buffer incorporating an ESD protection circuit in accordance with the prior art.
Figure 1B:
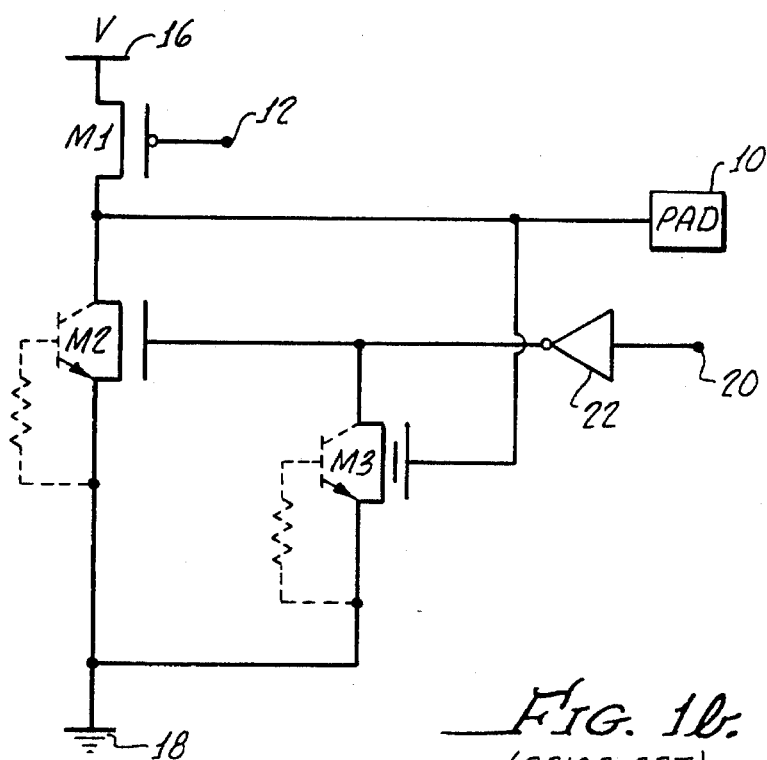
FIG. 1(b) shows an alternative version of the ESD protection circuit shown in FIG. 1(a) in accordance with the prior art.
Figure 2:
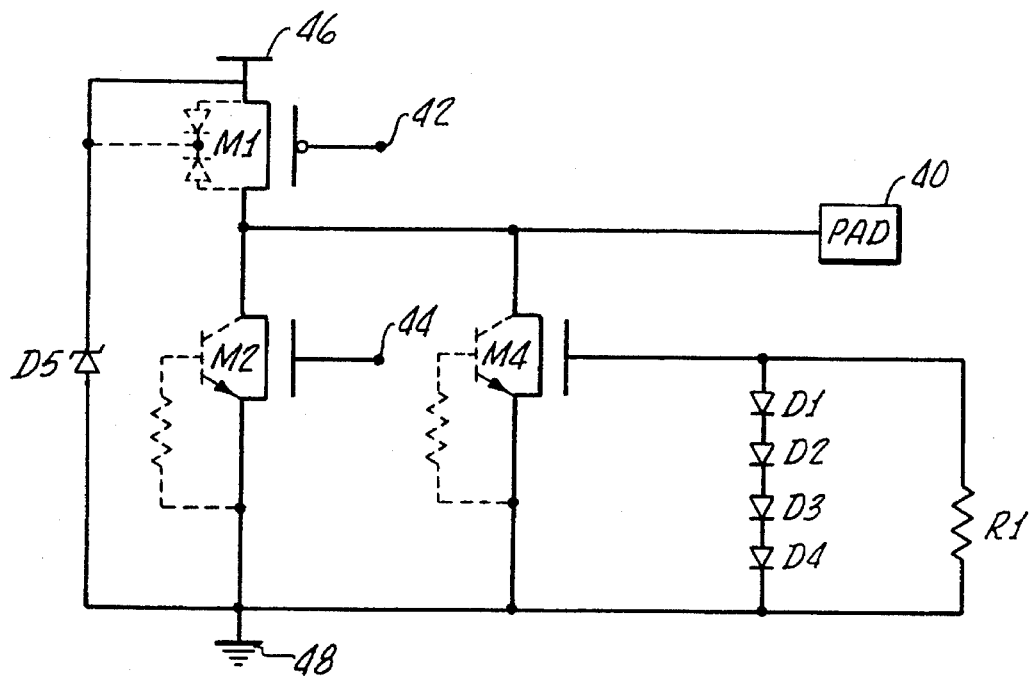
FIG. 2 is a schematic diagram of an exemplary preferred embodiment of the present invention.

FIG. 2 shows an initial example of use preferred embodiment of the present invention. Exemplary portion of a CMOS integrated circuit output buffer shown may, but need not necessarily, be similar to those shown in FIG. 1 in terms of normal functional operation. The operational FETS M1 and M2 can serve, for example, as an invertor, providing an output signal to pad 40 which is the logical inverse of an internal signal applied to signal input lines 42, 44. M1 and M2 are connected between an integrated circuit voltage supply 46, typically $V_{DD}$ or some other positive voltage supply, and the integrated circuit ground potential shown schematically at 48. During normal functional operation the protective transistor M4 will be open due to the resistance R1 holding its gate at a low voltage level. Resistor R1 is typically an N-well resistor for the type of CMOS circuit shown. It may be formed within an N-well region in a P-type substrate, or by any other suitable process. The formation of the N-well resistor will be discussed in greater detail below. The N-well prevents undesired triggering or excessive current leakage in protective transistor M4.

Transistors M2 and M4 are each shown in parallel with their respective lateral bipolar NPN parasitic transistors. These lateral bipolars are triggered during an ESD event and provide a more diffuse current path to prevent damage to any of the individual NMOS FETS. In the embodiment shown, both M2 and M4 are thin oxide NMOS FETS. The ESD current is optimally spread through the parallel NPNs by simultaneous triggering. The triggering of M4 is properly controlled by limiting the M4 gate voltage to about 1.0 to 2.5 volts dc. Within this voltage range it is possible to control the current flow through M4 and M2 during an ESD event such that an optimal distribution of ESD induced current will be achieved. The improved current distribution allows the integrated circuit to withstand higher level ESD pulses than would otherwise be possible, since absent an optimal distribution between M2 and M4, more current would flow through one or the other, resulting in a higher heat dissipation and a greater likelihood of damage for the NMOS FET carrying the higher current. It should be noted that a larger number of protective transistors may be included in a configuration similar to that of M4 in order to further increase the circuit's ability to withstand an ESD pulse applied to pad 40.

The diode voltage regulator which applies the proper voltage to the gate of transistor M4 includes a series combination of several PN junction diodes. As mentioned above, the proper current flow will be maintained through M4 by providing a voltage of about 1.0 to 2.5 volts dc at the gate of M4. In the preferred embodiment shown, four PN junction diodes, D1 and D4, are connected in series to provide a maximum gate voltage of about 2.4 volts. Since each diode accounts for a forward biased voltage drop of about 0.6 volts, the total voltage across the series combination will therefore be but 2.4 volts during an ESD event. Since an ESD event will typically result in a very high voltage, on the order of several thousand volts or more, being applied to pad 40, a limited base voltage will prevent M4 form drawing excessive current during the application of the ESD voltage.

In the preferred embodiment of FIG. 2 the diodes D1 to D4 are arranged such that the anode of D1 is electrically connected to the gate of M4, the cathode of D1 is electrically connected to the anode of the next diode in the series combination, D2, and the remaining diodes are electrically connected in a similar manner, with the cathode of the final diode in the series, D4, electrically connected to the ground potential 48. Many alternative arrangements could be used to provide a relative constant voltage to the M4 gate during an ESD event. For example, the number and type of diodes may be varied, as well as the forward voltage drop for each diode. Two diodes with a forward voltage drop of about 0.7 would provide gate voltage of 1.4 volts, within the desire range. A method of forming the preferred diode arrangement shown will be discussed in greater detail below.

An additional advantage of the present invention is illustrated in FIG. 2. A parasitic Zener diode D5 is formed as a result of a process to be illustrated and discussed in further detail below. The Zener diode D5 results from the interaction of an N+ region adjacent to a P− field implant region. The Zener D5 has a reverse breakdown voltage of about 7.5 volts dc at a knee current of about 1.0 microamps. The desired reverse breakdown voltage is about 7.5 to 10.0 volts dc, but the precise will vary as a function of the drain parameters of PMOS FET M1 and the N-well within which the PMOS FET is formed. The formation of the PMOS FET gives rise to two P-N junction diodes arranged cathode to cathode. The dashed line from two joined junction diode cathodes to the cathode of D5 is the N-well within which the PMOS FET and the N+ region of D5 are formed. The Zener diode D5 and one of the parasitic junction diodes of M1 make up a parasitic conductive path from pad to ground potential 48. This additional parasitic conductive path provides for increased resistance to ESD damage by directing a portion of the ESD-induced current away form NMOS devices M2 and M4. The Zener diode is designed to have a reverse breakdown voltage which is less than the breakdown voltage associated with the NMOS protective FETS, and higher than the supply voltage.

Figure 3:
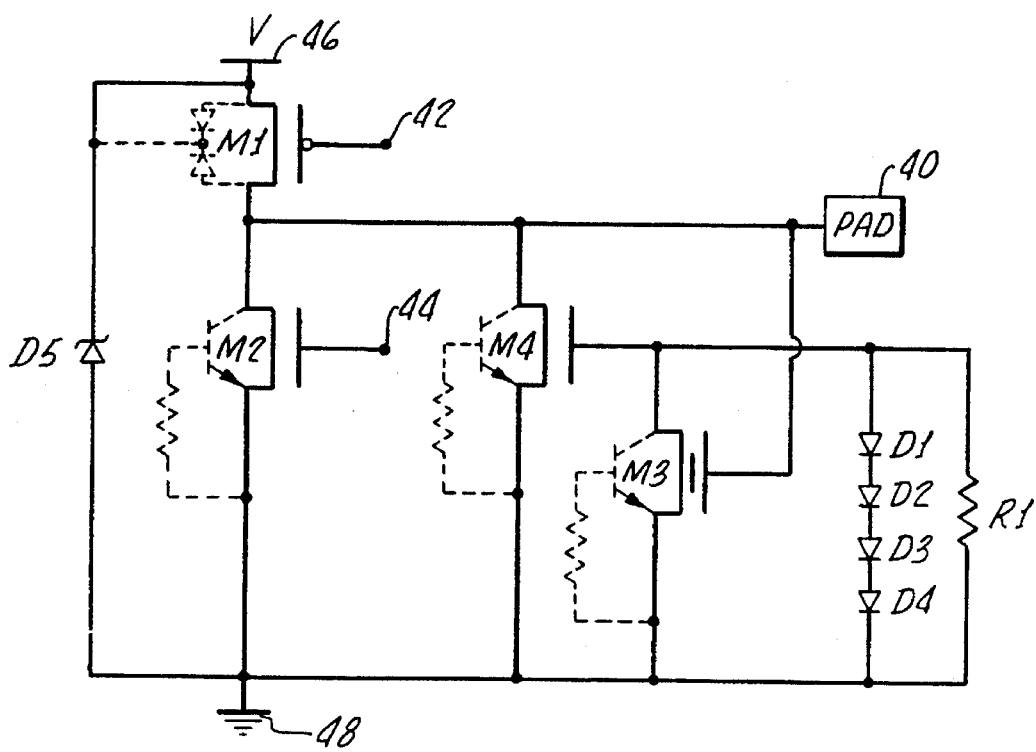
FIG. 3 is a second preferred embodiment of the present invention.

FIG. 3 shows a second preferred embodiment of the present invention. The operation of this embodiment is similar to the circuit discussed above in conjunction with FIG. 2, with the addition of a dynamic gate coupling via thick field oxide NMOS FET M3. This embodiment provides the advantages of dynamic gate coupling in terms of optimal triggering of lateral NPNs while avoiding the need for frequent red-design through the use of a diode voltage regulator. The thick field oxide device M3 operates to moderate the gate voltage of M4 during an ESD even such that M4 is not immediately triggered. The physical dimensions of M3 may be set such that adequate transient performance is provided during the period prior to the clamping of the M4 gate voltage by the diode voltage regulator consisting of diodes D1 through D4. M3 in effect acts as a second protective transistor which serves no significant operational function aside from providing protection against ESD damage.

Figure 4:
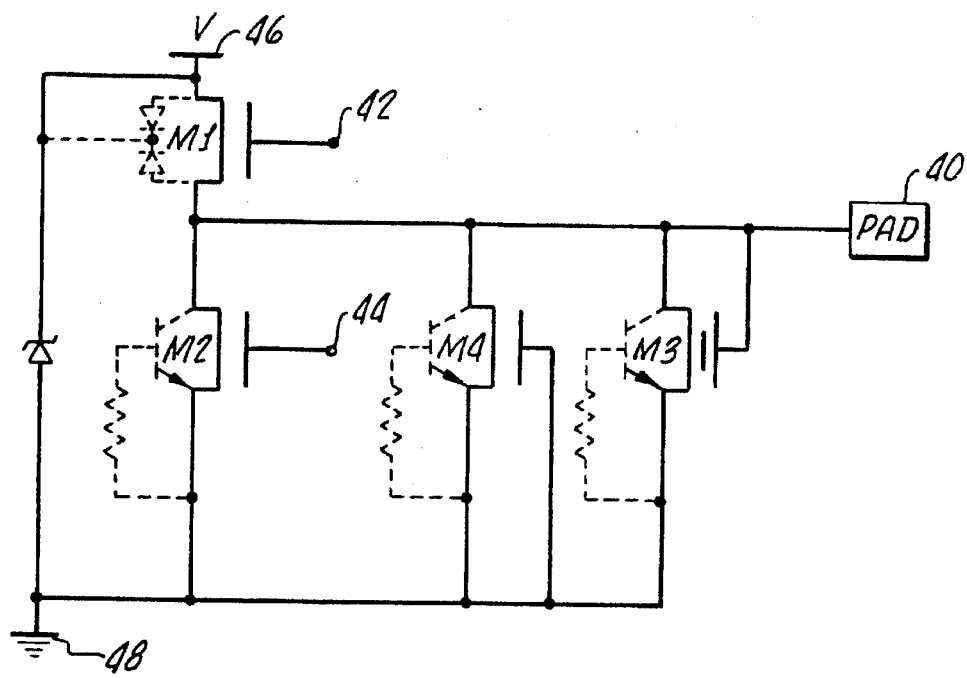
FIG. 4 is a schematic diagram of a third preferred embodiment of the present invention.

FIG. 4 shows a third preferred embodiment of the present invention. The basic operational circuitry consisting of M1 and M2 is similar to that described above in conjunction with FIG. 2. Like circuit elements from the previously described elements retain their respective designator in FIG. 4. The protective circuit of FIG. 4 includes a thin gate oxide NMOS FET M4 with a grounded gate is a first protective transistor and a thick filed oxide NMOS FET M3 with its gate and drain electrically connected to the pad 40 as a second protective transistor. The lateral NPN parasitics shown with M2, M3 and M4 provide parallel current paths for ESDO-induced current. The grounding of the M4 gate effectively limits the voltage turn-on of M4, while the thick field oxide device M3 is directly triggered into a high conductivity mode upon application of the high voltage ESD pulse to pad 401. The protective circuit of FIG. 4 includes an additional measure of ESD protection over prior art circuits which include one or more or the grounded gate thin gate oxide NMOS or the thick field oxide devices as a result of the parasitic conductive path made up by the Zener diode D5 and the parasitic PN junction diode of PMOS FET M1. The operation of this parasitic conductive path is similar in this exemplary circuit to the operation describe in conjunction with FIG. 2, and is shown here to illustrate its usefulness apart from the diode voltage regulator circuit of FIGS. 2 and 3. The parasitic Zener and PMOS PN junction diode may be utilized in a wide variety of configurations to provide improved ESC protection without increasing cost or adversely affecting operational performance of the integrated circuit.

Figure 5:
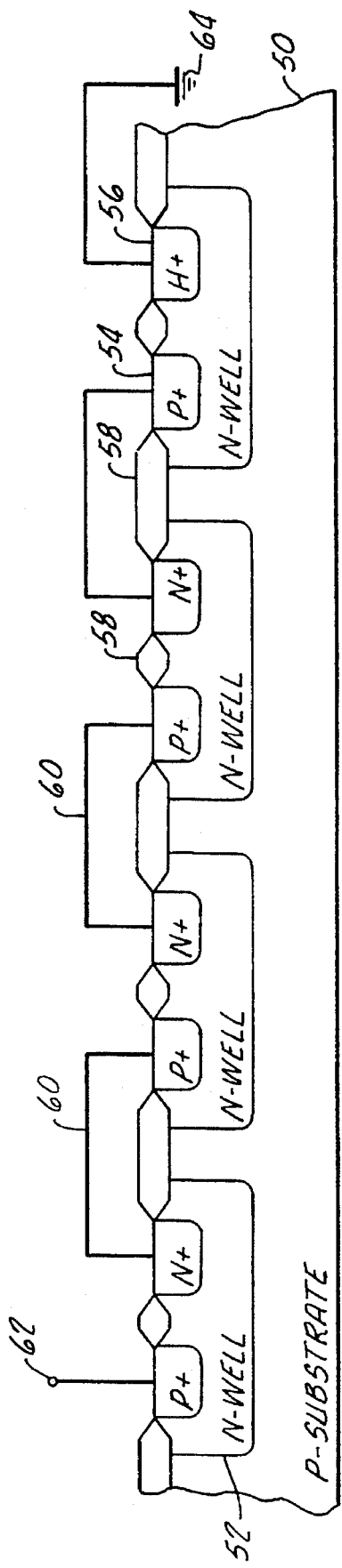
FIG. 5 is a cross-sectional view of a portion of an exemplary integrated circuit showing a diode voltage regulator in accordance with the present invention.

FIG. 5 is a cross-sectional view of a portion of an exemplary integrated circuit showing a diode voltage regulator in accordance with the present invention. The diode voltage regulator is formed on a P-type substrate 50 in several adjacent N-wells 52. Each of the N-wells 52 include P+ and N+ region, 54, 56 respectively, are formed therein by diffusion, implantation or other suitable processes well known in the art. A layer of field oxide 58 covers the surface of the integrated circuit. Portions of the P+ and N+ regions 54, 56 are exposed through openings in the field oxide 58 to allow interconnection between the P+ and N+ regions to form a series combination of PN junction diodes. This interconnection will typically be made through a metallization layer. In FIG. 5 the interconnection is shown schematically, with interconnect lines 60 forming a series combination of four diodes between terminal 62, which will be electrically connected to the gate of a first protective transistor M4, and terminal 64, which represents ground potential within the integrated circuit. Each of the P+ regions 54 makes up the anode of a diode, while each of the N+ regions 56 makes up the cathode of a diode. Alternative methods of diode formation and arrangement could also be used.

Figure 6:
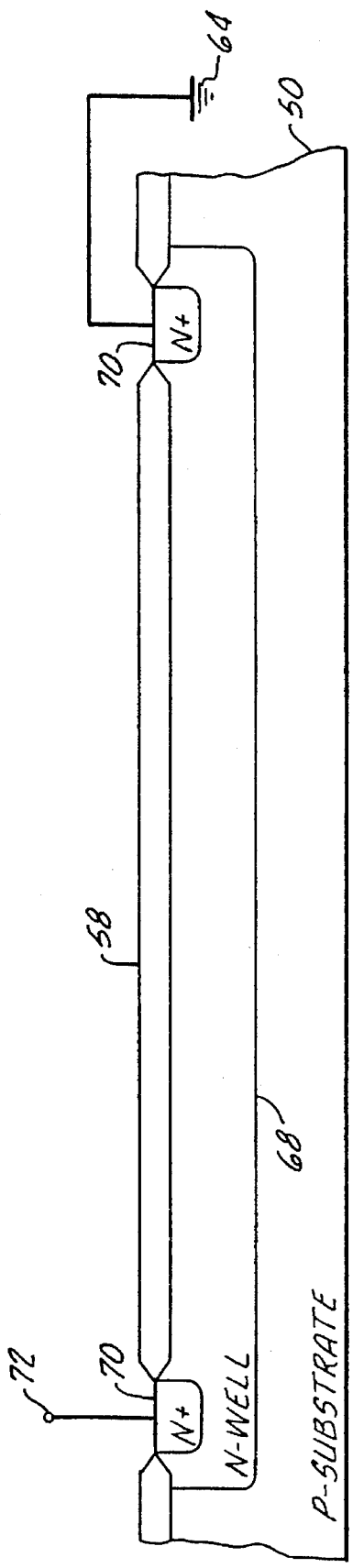
FIG. 6 is a cross-sectional view of a portion of an exemplary integrated circuit showing an N-well resistor in accordance with the present invention.

FIG. 6 illustrates a cross-sectional view of an N-well resistor formed in accordance with the present invention. The resistor is formed within N-well 68 on P-type substrate 50. Two distinct N+ regions 70 are formed within N-well 68. Each of the N+ regions 70 make up a terminal of the N-well resistor. Interconnection to other circuit elements is made via metallization represented schematically by lines in FIG. 6 between terminal 72 and ground potential 64. Terminal 72 is electrically connected to the gate of a first protective transistor such as M4, in parallel with the diode voltage regulator including diodes D1 through D4. The resistance value of the N-well resistor is a function of the resistivity of the N-well material and the spacing between the N+ regions which make up the resistor terminals. A variety of other techniques could be used to form a resistor suitable for use in the present invention. The resistor need not be an N-well resistor although that type of resistor is preferred in the exemplary P-type substrate CMOS output buffer shown.

Figure 7:
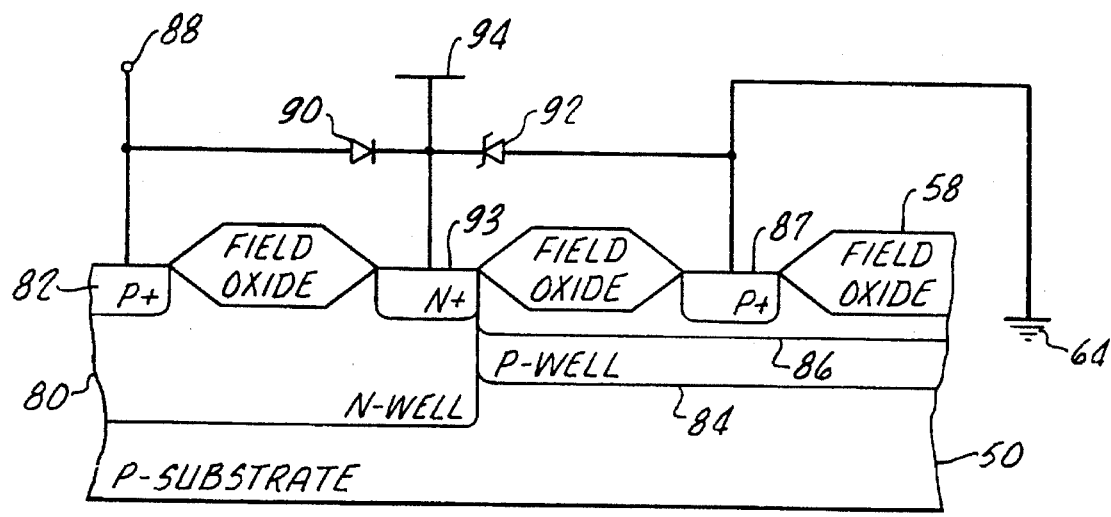
FIG. 7 is a cross-sectional view of a portion of an exemplary integrated circuit showing the manner of forming a parasitic conductive path including a series arrangement of a junction diode and a Zener diode.

FIG. 7 is a cross sectional view of a portion of the exemplary integrated circuit of either FIGS. 2, 3 or 4 showing the preferred construction of the parasitic conductive path associated with PMOS FET M1. PMOS FET M1 is formed in N-well 80 on P-type substrate 50.

For purposes of clarity only part of the P+ drain 32 of the PMOS FET M1 is shown. Also, the relative sizes of the various regions are not drawn to scale in FIG. 7, but are instead enlarged in order to emphasize particular features. The PMOS FET M1 includes both a source and a drain P+ region, with a channel there between in the N-well material. The operative PMOS FET M1 is formed by two P+ regions in N-well 80, and includes a source (not shown) electrically connected to a positive supply voltage of the integrated circuit, a drain 82 electrically connected via terminal 88 to a pad of the integrated circuit, and a gate (not shown) for receiving a logic or other functional signal internal to the integrated circuit.

A P-well 84 is also formed on the P-type substrate 50 adjacent to the N-well 80 in which PMOS M1 is formed. A P− field implant 86 is formed with P-well 84 and extends to the edge of the P-well 84 adjacent the N-well 80. The P− field implant is electrically connected to ground potential 64 via a P+ region 87. As a result of this layout, a parasitic conductive path is established between terminal 88 representing the drain of PMOS FET M1 electrically connected to the integrated circuit 40, and ground potential 64. The parasitic conductive path includes a parasitic PN junction diode shown schematically at 90 formed by the P+ drain 82 and N-well 80, and a parasitic Zener diode shown schematically at 92, formed by the N+ region 93 and the P− field implant 86. N+ region 93 represents the cathode of the Zener diode 92, and is electrically connected to the positive supply voltage 94 and the cathode of PN junction diode 90. P+ region 82 is the anode of the PN junction diode 90. P− field implant 86 is the anode of the Zener diode 92, electrically connected to ground potential 64 via P+ region 87. As in FIGS. 5 and 6, the interconnection among the various regions and terminals in FIG. 7 are made through windows in the field oxide layer 58 overlying the integrated circuit.

The first protective NMOS FET M4 is formed in a P-well on P-type substrate 50, with its drain region connected to the pad 40 and its source connected to ground potential 64. The gate of first protective transistor M4 is electrically connected to the diode voltage regulator and N-well resistor as was discussed above. It should be noted that first protective transistor M4 is a thin gate oxide NMOS device, and as such may be a spare, otherwise unused NMOS device within the integrated circuit I/O buffer. The device M4 therefore need not be separately formed in a manner distinct form any of the other NMOS devices in the I/O.

The second protective NMOS FET M3, typically a thick field oxide device, is also formed in a P-well on P-type substrate 50. In one embodiment, shown in FIG. 3, the drain of M3 is electrically connected to the gate of first protective transistor M4, and the gate of M3 is electrically connected to the integrated circuit pad 40 and thereby to the drain of M4. In the alternative embodiment of FIG. 4, the drain and the gate of second protective transistor M3 are electrically connected to pad 40 and the drain of M4, and the gate of M4 is electrically connected to ground potential. In both embodiments, however, the parasitic conductive path through the junction diode 90 associated with M1 and the Zener diode 92 may be used to provide an additional measure of protection against ESD damage.

The foregoing description was directed to several exemplary embodiments of the present invention shown implemented in exemplary CMOS output buffers. It should again be emphasized that the present invention is limited to the exemplary circuits and processes described. The ESD protection circuit may be implemented in other parts of a variety of integrated circuits with different configuration and layouts of semiconductor material types. These and other alternatives will be readily apparent to those skilled in the art, and the scope of the present invention is therefore limited only by the scope of the appended claims.

What is claimed is:

1. An electro-static discharge protection circuit adapted for use in an integrated circuit, comprising:

a first protective field effect transistor connected between a pad of said integrated circuit and a potential of said integrated circuit and having a gate, said first transistor responsive to a voltage applied to said gate to control a current through said first transistor; and a voltage regulator connected between said gate of said first protective transistor and said potential of said IC, said voltage regulator operative to apply said voltage to said gate such that a desired amount of current flows through said first transistor when an electro-static discharge is applied to said pad, wherein:

said potential is a ground potential and said first protective transistor is an NMOS field effect transistor having a drain electrically connected to said pad, and a source electrically connected to said ground potential; and said voltage regulator comprises:

a first diode having an anode connected to said gate of said first transistor, and a cathode;

a second diode having an anode connected to said cathode of said first diode, and a cathode; and a third diode having an anode connected to said cathode of said second and a cathode connected to said ground potential of said IC.

2. The circuit of claim 1 wherein said voltage regulator further includes at least one additional diode having an anode and a cathode, said additional diode connected in series between said first and said second diodes such that said anode of said additional diode is electrically connected between said cathode of said first diode and said anode of said second diode.

3. The circuit of claim 1 wherein said first protective transistor is a spare transistor within said IC and is unused during normal IC operation.

4. The circuit of claim 3 further including a resistor connected in parallel with said voltage regulator.

5. The circuit of claim 4 wherein said resistor is an N-well resistor.

6. An electro-static discharge protection circuit adapted for use in an integrated circuit, comprising:

a first protective field effect transistor connected between a pad of said integrated circuit and a potential of said integrated circuit and having a gate, said first transistor responsive to a voltage applied to said gate to control a current through said first transistor; and a voltage regulator connected between said gate of said first protective transistor and said potential of said IC, said voltage regulator operative to apply said voltage to said gate such that a desired amount of current flows through said first transistor when an electro-static discharge is applied to said pad;

wherein said potential is a ground potential and said first protective transistor is an NMOS field effect transistor having a drain electrically connected to said pad, and a source electrically connected to said ground potential; and the circuit further comprises a second protective field effect transistor having a gate electrically connected to said pad and said drain of said first protective transistor, a drain connected to said gate of said first transistor, a drain connected to said gate of said first transistor, and a source connected to said ground potential of said IC.

7. The circuit of claim 6 wherein said second protective field effect transistor is a thick field oxide field effect transistor.

8. An electro-static discharge protection circuit adapted for use in an integrated circuit, comprising:

a first protective field effect transistor connected between a pad of said integrated circuit and a potential of said integrated circuit and having a gate, said first transistor responsive to a voltage applied to said gate to control a current through said first transistor; and a voltage regulator connected between said gate of said first protective transistor and said potential of said IC, said voltage regulator operative to apply said voltage to said gate such that a desired amount of current flows through said first transistor when an electro-static discharge is applied to said pad;

wherein said IC further includes a first operative transistor and a second operative transistor, wherein said first operative transistor is a PMOS FET and said second operative transistor is an NMOS FET, a drain of said first operative transistor electrically connected to a drain of said second operative transistor and to said pad, a source of said first operative transistor electrically connected to a supply voltage of said IC, and a source of said second operative transistor electrically connected to a ground potential of said IC, such that said first operative transistor forms a parasitic conductive path between said pad and said ground potential.

9. The circuit of claim 8 wherein said parasitic conductive path includes:

a first operative transistor parasitic diode having an anode electrically connected to said pad, and a cathode; and a parasitic Zener diode having a cathode electrically connected to said cathode of said parasitic diode, and an anode connected to said ground potential such that current flows through said parasitic conductive path when an electrostatic discharge is applied to said pad.

10. The circuit of claim 9 wherein said Zener diode has a reverse breakdown voltage of about 3.3 to 10.0 volts dc.

* * * * *